US006903596B2

(12) United States Patent
Geller et al.

(10) Patent No.: US 6,903,596 B2
(45) Date of Patent: Jun. 7, 2005

(54) METHOD AND SYSTEM FOR IMPEDANCE MATCHED SWITCHING

(75) Inventors: Bernard Geller, Durham, NC (US); Glen C. Metheny, Raleigh, NC (US); Daniel Shaw, Louisburg, NC (US)

(73) Assignee: Mitsubishi Electric & Electronics U.S.A., Inc., Cypress, CA (US)

( * ) Notice: Subject to any disclaimer, the term of this patent is extended or adjusted under 35 U.S.C. 154(b) by 0 days.

(21) Appl. No.: 10/388,459

(22) Filed: Mar. 17, 2003

(65) Prior Publication Data

US 2004/0183623 A1 Sep. 23, 2004

(51) Int. Cl.[7] .............................................. H03K 17/687

(52) U.S. Cl. ....................................... 327/427; 327/308

(58) Field of Search ................................ 327/308, 419, 327/427, 365, 374; 333/101, 103, 81 A, 81 R, 262

(56) References Cited

U.S. PATENT DOCUMENTS 4,890,077 A * 12/1989 Sun .......................... 333/81 A
5,345,123 A * 9/1994 Staudinger et al. ......... 327/308
5,717,356 A * 2/1998 Kohama ...................... 327/427
5,731,607 A 3/1998 Kohama ...................... 257/275
5,767,721 A 6/1998 Crampton ................... 327/308
5,812,939 A * 9/1998 Kohama ....................... 455/78
5,818,283 A 10/1998 Tonami et al. .............. 327/436
5,825,227 A * 10/1998 Kohama et al. ............ 327/308
5,990,580 A 11/1999 Weigand ..................... 307/105

* cited by examiner

*Primary Examiner*—Minh Nguyen
(74) *Attorney, Agent, or Firm*—Burns, Doane, Swecker & Mathis, L.L.P.

(57) ABSTRACT

A system for impedance matched switching of an input signal from an input source includes a first switch, such as an FET, for controllably switching the input signal from an input terminal connected to the input source to an output terminal, the switching being controlled according to a control voltage. The system further includes a second switch, such as an FET, for controllably switching a matching impedance between the input terminal and ground according to the control voltage. When the input signal is prevented from passing from the input terminal to the output terminal by the first switch, the input signal passes through the matching impedance, which has an impedance characteristic substantially matched to an impedance characteristic of the input source.

12 Claims, 3 Drawing Sheets

METHOD AND SYSTEM FOR IMPEDANCE MATCHED SWITCHING

BACKGROUND

The invention relates to electronic switches. More particularly, the invention relates to a method and system for switching signals according to a control voltage and having impedance matching means.

Semiconductor devices are typically used in a wide variety of electronic switching circuit applications that require high speed switching, such as RF and microwave switching applications. For example, a Field Effect Transistor (FET) is often used as a single switch in a switching circuit. An FET includes a drain terminal, a source terminal, and a gate terminal, with current being switched between the drain and source terminal according to a control signal applied to the gate terminal.

FIG. 1 illustrates an example of a conventional switching circuit, as described in U.S. Pat. No. 5,767,721, in a single pole, single throw (SPST) switch circuit configuration utilizing two depletion-mode FETs. Referring to FIG. 1, a series FET 100 is coupled between an input terminal 10 and an output terminal 20 to allow signals to be transferred between the terminals 10, 20 when turned on and block such transmission when turned off. Respective coupling capacitors 30, 40 are interposed between each terminal 10, 20 and the series FET 100 to block DC voltages while admitting AC signals with little or no attenuation. The drain terminal 101 and source terminal 102 of the series FET 100 are each coupled to a predetermined positive potential V+ by respective biasing resistors 50, 60. The gate terminal 103 of the series FET 100 is coupled to the control voltage V1 via a gate resistor 70. Biasing the series FET 100 in this manner enables it to be turned off when V1 is at a zero potential.

The circuit also includes a shunt FET 150 coupled to the series FET 100 in a shunt configuration. In particular, the drain terminal 151 of the shunt FET 150 is coupled to the source terminal 102 of the series FET 100 through a third coupling capacitor 80, which is also utilized to block DC signals. The source terminal 152 of the shunt FET 150 is coupled to ground via a fourth coupling capacitor 85. The gate terminal 153 of the shunt FET 150 is also coupled to ground via a second gate resistor 82.

The drain terminal 151 and source terminal 152 of the shunt FET 150 are also coupled to the control voltage V1 by respective high value biasing resistors 90, 95. Biasing the shunt FET 150 in this manner enables it to be turned on when V1 is at a zero voltage and turned off when V1 is at a significant positive voltage.

In operation, the switch circuit of FIG. 1 operates in either an "on" or "off" mode. When the control voltage V1 transitions from a zero to a positive potential, the switch circuit enters the on mode, which causes the series FET 100 to be turned on while simultaneously turning off the shunt FET 150. In this mode, the series FET 100 allows signals to be transmitted between the input and output terminals 10, 20 while the shunt FET 150 does not pass any significant current.

In contrast, while in the off mode, i.e., when the control voltage V1 transitions to back a zero potential, the series FET 100 is turned off and the shunt FET 150 is turned on. Since the series FET 100 is off, signals are effectively blocked from being transmitted between the terminals 10, 20. Meanwhile, the shunt FET 150 is on, which provides a low impedance path to ground at the output terminal 20 for input isolation purposes.

There are, however, limitations in the prior art systems. Particularly, in the off mode, a highly reflective load impedance is connected to the input of the switch, which effectively reflects RF signals input to the switch back to the source. This configuration provides isolation at the input of the switch, i.e., from input to output, but offers limited isolation for signal sources common to the output, i.e., from output to input.

SUMMARY OF THE INVENTION

It should be emphasized that the terms "comprises" and "comprising", when used in this specification as well as the claims, are taken to specify the presence of stated features, steps or components; but the use of these terms does not preclude the presence or addition of one or more other features, steps, components or groups thereof.

Accordingly, a method and system are disclosed for impedance matched switching. According to exemplary embodiments, a system for impedance matched switching of an input signal from an input source includes a first means, such as an FET, for controllably switching the input signal from an input terminal connected to the input source to an output terminal, the switching being controlled according to a control voltage. The system further includes a second means, such as an FET, for controllably switching a matching impedance between the input terminal and ground according to the control voltage. When the input signal is prevented from passing from the input terminal to the output terminal by the first means for controllably switching, the input signal passes through the matching impedance, which has an impedance characteristic substantially matched to an impedance characteristic of the input source.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Preferred embodiments of the present invention are described below with reference to the accompanying drawings. In the following description, well-known functions and/or constructions are not described in detail to avoid obscuring the invention in unnecessary detail.

It should be emphasized that the terms "comprises" and "comprising", when used in this specification as well as the claims, are taken to specify the presence of stated features, steps or components; but the use of these terms does not preclude the presence or addition of one or more other features, steps, components or groups thereof.

Figure 1:
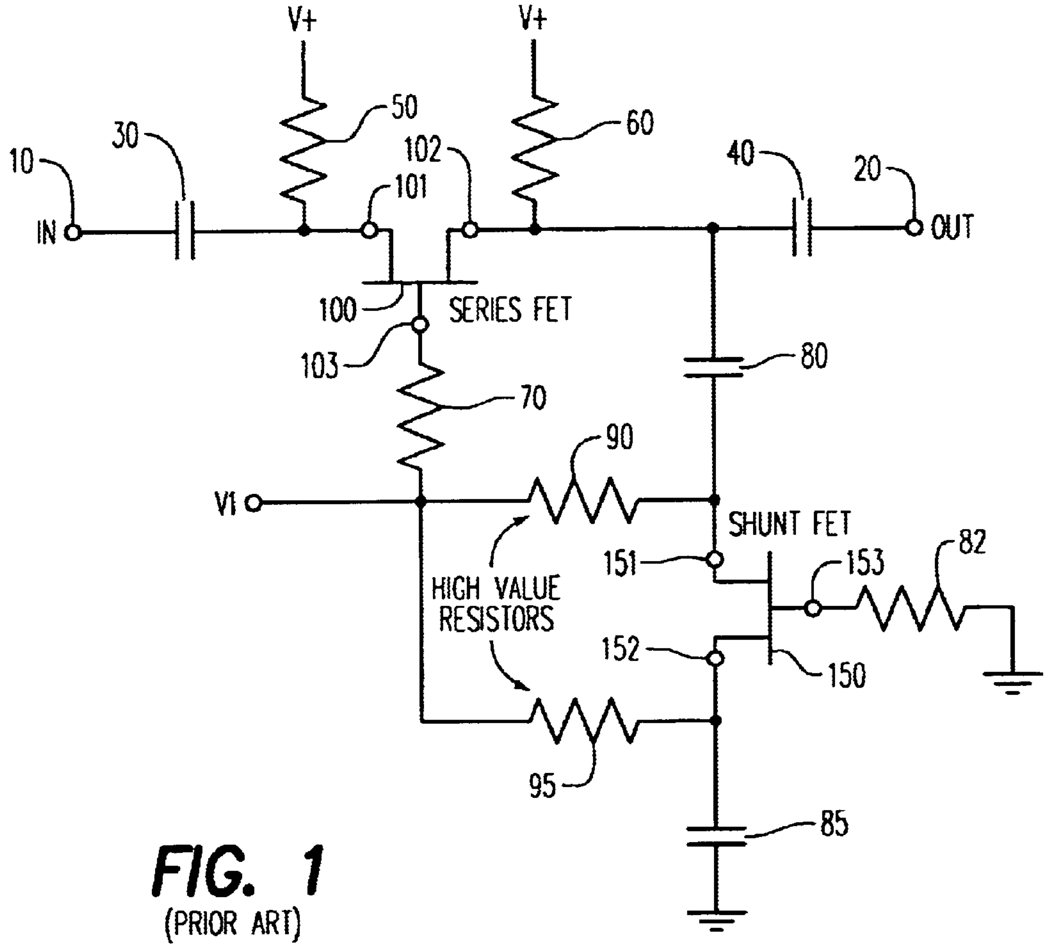
FIG. 1 (PRIOR ART)
FIG. 1 is a schematic diagram illustrating a conventional switching circuit.
Figure 2:
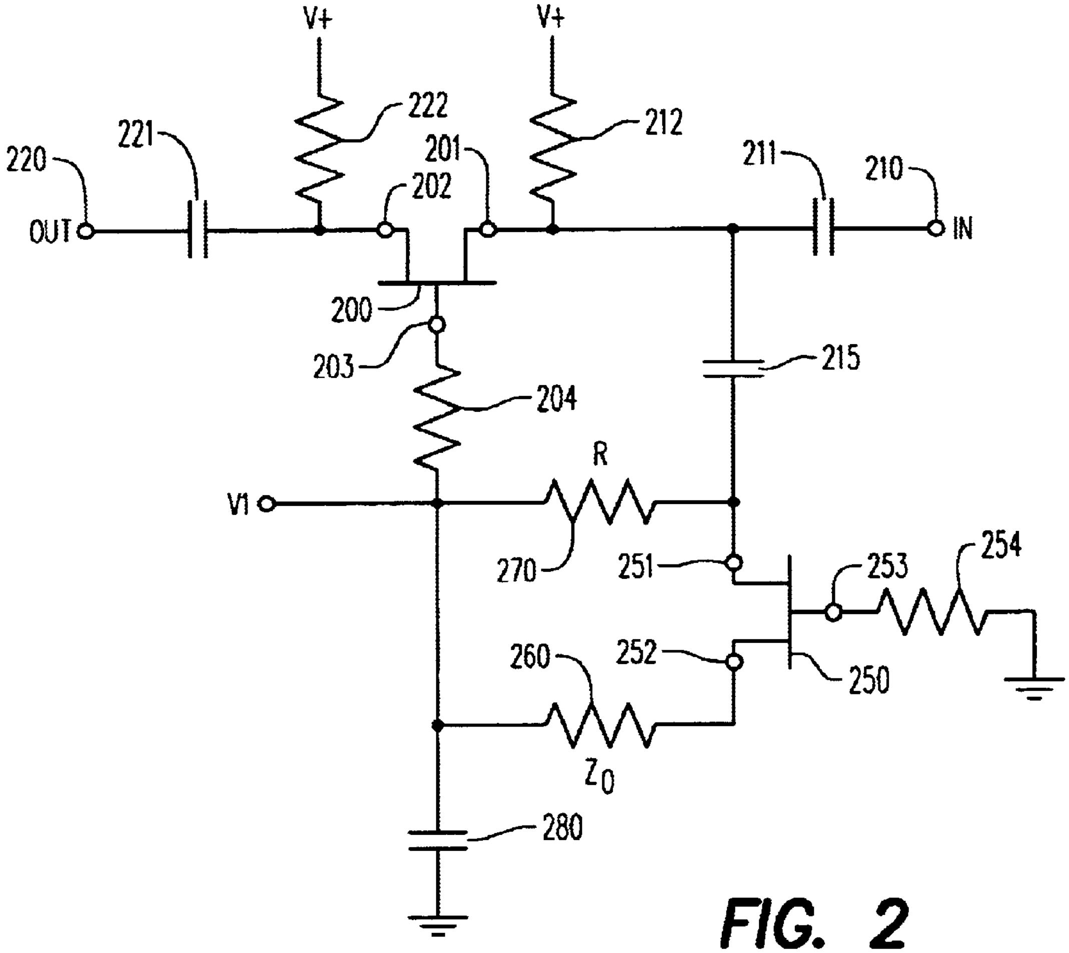
FIG. 2 is a schematic diagram illustrating a switching circuit according to an embodiment of the invention.

Turning again to the drawings, FIG. 2 illustrates a switch circuit according to an embodiment of the invention. A series FET 200 is coupled between an input terminal 210 and an output terminal 220 to allow signals to be transferred between the terminals 210, 220 when turned on and block such transmission when turned off. Respective coupling capacitors 211, 221 are interposed between each terminal 210, 220 and the series FET 200 to block DC voltages while admitting AC signals with little or no attenuation. The drain terminal 201 and source terminal 202 of the series FET 200 are each coupled to a predetermined positive potential V+ by respective biasing resistors 212, 222. The gate terminal 203 of the series FET 100 is coupled to the control voltage V1 via a gate resistor 204. Biasing the series FET 200 in this manner enables it to be turned off when V1 is at a zero potential.

The circuit also includes a shunt FET 250 coupled to the series FET 200 in a shunt configuration. In the switch circuit according to the invention, however, the shunt FET 250 operates to switch in a matching impedance $Z_0$ 260. That is, in contrast to the prior art, the shunt FET 250 does not merely switch in a path to ground, which is a highly reflective load impedance condition. Instead, the shunt FET 250 switches in the matching impedance $Z_0$ 260. In particular, the drain terminal 251 of the shunt FET 250 is coupled to the drain terminal 201 of the series FET 200 through a third coupling capacitor 215, which blocks DC signals. The drain terminal 251 and source terminal 252 of the shunt FET 250 are coupled respectively to a high value biasing resistor 270 and to $Z_0$ 260, which are connected to biasing voltage V1. The shunt FET 250 is also coupled to ground via $Z_0$ 260 and the high value biasing resistor 270 in parallel and a fourth coupling capacitor 280. The impedance value of $Z_0$ 260 is selected to match substantially the input source impedance. The impedance of the high value biasing resistor 270 is set much higher than that of $Z_0$ 260, so that the parallel combination yields an impedance value that is essentially the matching impedance value of $Z_0$ 260.

Biasing the shunt FET 250 in this manner enables it to be turned on when V1 is at a zero voltage and turned off when V1 is at a significant positive voltage. The difference in values between the high value biasing resistor 270 and $Z_0$ 260 has shown to have little or no adverse biasing affect. The gate terminal 253 of the shunt FET 250 is coupled to ground via a second gate resistor 254.

In operation, when in the on mode, i.e., after the control voltage V1 transitions from a zero to a positive potential, the series FET 200 is turned on and the shunt FET 250 is turned off. In this mode, the series FET 200 allows signals to be transmitted between the input and output terminals 210, 220 while the shunt FET 250 does not pass any significant current.

In the off mode, i.e., after the control voltage V1 transitions to a zero potential, the shunt FET 250 is turned on, and the series FET 200 is turned off, which effectively blocks signals from being transmitted between the input and output terminals 210, 220. In contrast to the prior art, however, while in the off mode, the shunt FET 250 switches in an impedance path to ground comprising $Z_0$ 260 and the high value biasing resistor 270 in parallel, which has essentially the same value as $Z_0$ 260.

Many applications today require impedance matching at all inputs to prevent Voltage Standing Wave Ratio (VSWR) problems. VSWR is a measure of impedance mismatch between a source, e.g., a transmission line, and the associated load. The higher the VSWR, the greater the mismatch. The minimum VSWR, i.e., that which corresponds to a perfect impedance match, is unity.

Since $Z_0$ 260 is matched to the input source, instead of reflecting an input signal received at the input terminal 210 back to the source as in the prior art switch circuit, the input source is connected to a matched load impedance that absorbs the input signals while the switch circuit is in the off mode. Consequently, the switch circuit configuration according to the invention enhances the isolation offered from output to input, i.e., looking in from the output, while in the off mode. Accordingly, signal sources common to the output are better isolated from the input source.

Figure 3:
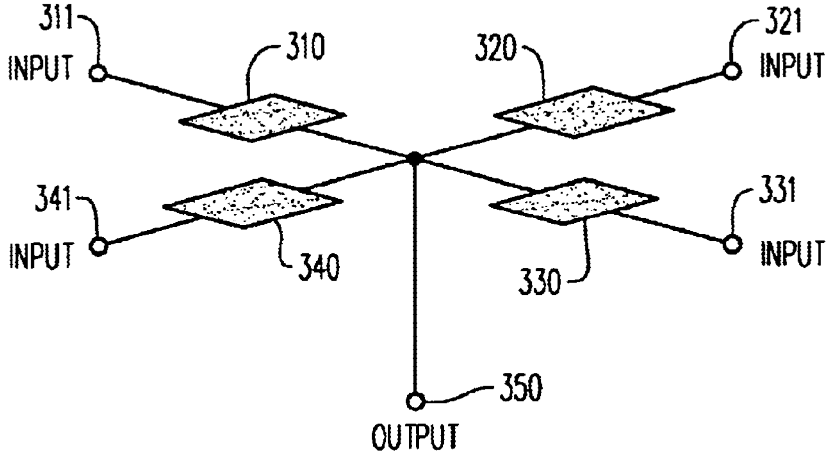
FIG. 3 is a block diagram illustrating a switch matrix application according to an embodiment of the invention.

FIG. 3 illustrates one possible application that takes advantage of the enhanced output-to-input isolation offered by the switch circuit of FIG. 2. In FIG. 3, four SPST switch circuits 310, 320, 330, 340 are connected via their respective output terminals to a common output 350 to form a switch matrix that can select one of four respective inputs 311, 321, 331, 341 to be switched to the common output 350. In operation, only one of the switch circuits 310, 320, 330, 340 is in the on mode at a time, with the other three being in the off mode.

The switch circuit according to the invention offers advantages in the configuration of FIG. 3 due to the enhanced output-to-input isolation. Signals reaching the output terminal 350 from the selected input source are more effectively isolated from affecting the other three input sources.

While FET's are used as switching devices in the circuit of FIG. 2, it will be understood by those of ordinary skill in this art that other switching devices may be substituted without departing from the scope and spirit of the invention.

Various embodiments of Applicants' invention have been described, but it will be appreciated by those of ordinary skill in this art that these embodiments are merely illustrative and that many other embodiments are possible. The intended scope of the invention is set forth by the following claims, rather than the preceding description, and all variations that fall within the scope of the claims are intended to be embraced therein.

What is claimed is:

1. A system for impedance matched switching of an input signal from an input source, the system comprising:

first means for controllably switching the input signal from an input terminal connected to the input source to an output terminal, said switching controlled according to a control voltage; and second means for controllably switching a matching impedance means between the input terminal and ground according to the control voltage, wherein when the input signal is prevented from passing from the input terminal to the output terminal by the first means for controllably switching, the input signal passes through the matching impedance means, said matching impedance means having an impedance characteristic substantially matched to an impedance characteristic of the input source.

2. The system of claim 1, wherein at least one of the first and second means for controllably switching comprises a FET.

3. The system of claim 1, wherein at least one of the first and second means for controllably switching comprises a depletion-mode FET.

4. The system of claim 1, wherein the matching impedance means comprises a high value biasing resistor and a lower value resistor that are connected in parallel when said second switching means is actuated, the parallel combination of the two resistors having an impedance characteristic substantially matched to the impedance characteristic of the input source.

5. The system of claim 1, wherein the first means for controllably switching is coupled to the input terminal via a first coupling capacitor and to the output terminal via a second coupling capacitor.

6. A system for impedance matched switching of a plurality of input signals, each from a respective plurality of input sources, to a common output terminal, the system comprising:

a plurality of switching circuits each having their respective output terminal connected to the common output, each switching circuit comprising:

first means for controllably switching the input signal from an input terminal connected to the input source to an output terminal connected to the common output, said switching controlled according to a control voltage; and second means for controllably switching a matching impedance means between the input terminal and ground according to the control voltage, wherein when the input signal is prevented from passing from the input terminal to the output terminal by the first means for controllably switching, the input signal passes through the matching impedance means, said matching impedance means having an impedance characteristic substantially matched to an impedance characteristic of the input source.

7. The system of claim 6, wherein at least one of the first and second means for controllably switching comprises a FET.

8. The system of claim 6, wherein at least one of the first and second means for controllably switching comprises a depletion-mode FET.

9. The system of claim 6, wherein the matching impedance means comprises a high value biasing resistor and a lower value resistor that are connected in parallel when said second switching means is actuated, the parallel combination of the two resistors having an impedance characteristic substantially matched to the impedance characteristic of the input source.

10. The system of claim 6, wherein the first means for controllably switching is coupled to the input terminal via a first coupling capacitor and to the output terminal via a second coupling capacitor.

11. A method for impedance matched switching of an input signal from an input source, the method comprising the steps of:

controllably switching the input signal from an input terminal connected to the input source to an output terminal, said switching controlled according to a control voltage; and controllably switching a matching impedance means between the input terminal and ground according to the control voltage, wherein when the input signal is prevented from passing from the input terminal to the output terminal by the first means for controllably switching, the input signal passes through the matching impedance means, said matching impedance means having an impedance characteristic substantially matched to an impedance characteristic of the input source.

12. A circuit for impedance matched switching of an input signal from an input source, the circuit comprising:

a first FET coupled to the input terminal via a first coupling capacitor and coupled to the output terminal via a second coupling capacitor, wherein a source terminal and a drain terminal of the first FET are each coupled to a positive potential via respective first and second biasing resistors and a gate terminal of the first FET is coupled to a control voltage via a first gate resistor; and a second FET having a drain terminal coupled, via a third coupling capacitor, to a connection between the first FET and the first coupling capacitor, the drain terminal also coupled to the control voltage via a high impedance biasing resistor, a source terminal of the second FET being coupled to the control voltage via an impedance matching biasing resistor, the control voltage being coupled to ground at a junction of the high impedance biasing resistor, the impedance matching biasing resistor, and the first gate resistor via a fourth coupling capacitor, and a gate terminal of the second FET being coupled to ground via a second gate resistor, wherein a combined impedance characteristic of the high impedance biasing resistor and the impedance matching biasing resistor is substantially matched to an impedance characteristic of the input source.

* * * * *